United States Patent
Win et al.

(10) Patent No.: US 9,287,424 B2
(45) Date of Patent: Mar. 15, 2016

(54) POLYIMIDE RESIN COMPOSITION FOR USE IN FORMING REVERSE REFLECTING LAYER IN PHOTOVOLTAIC CELL AND METHOD OF FORMING REVERSE REFLECTING LAYER IN PHOTOVOLTAIC CELL USED THEREWITH

(75) Inventors: Maw Soe Win, Yokohama (JP);
Toshiyuki Goshima, Yokohama (JP);
Takahiro Sato, Yokohama (JP);
Hidenao Takato, Tsukuba (JP); Isao Sakata, Tsukuba (JP)

(73) Assignee: PI R&D CO., LTD., Kawasaki-Shi (JP)

( * ) Notice: Subject to any disclaimer, the term of this patent is extended or adjusted under 35 U.S.C. 154(b) by 316 days.

(21) Appl. No.: 13/822,955

(22) PCT Filed: Sep. 20, 2011

(86) PCT No.: PCT/JP2011/071354
§ 371 (c)(1),
(2), (4) Date: Aug. 2, 2013

(87) PCT Pub. No.: WO2012/039388
PCT Pub. Date: Mar. 29, 2012

(65) Prior Publication Data
US 2013/0310482 A1   Nov. 21, 2013

(30) Foreign Application Priority Data
Sep. 21, 2010   (JP) .................. 2010-211179

(51) Int. Cl.
*H01L 31/0232* (2014.01)
*C09D 179/08* (2006.01)
(Continued)

(52) U.S. Cl.
CPC ........ *H01L 31/02327* (2013.01); *C08G 73/106* (2013.01); *C08G 73/1039* (2013.01);
(Continued)

(58) Field of Classification Search
None
See application file for complete search history.

(56) References Cited

U.S. PATENT DOCUMENTS

| 4,927,770 A | 5/1990 | Swanson |
| 5,053,083 A | 10/1991 | Sinton |

(Continued)

FOREIGN PATENT DOCUMENTS

| DE | 102011012242 A1 | 9/2011 |
| EP | 1145845 A1 | 10/2001 |

(Continued)

OTHER PUBLICATIONS

Extended European Search Report dated Oct. 30, 2014, issued in 11826833.3.
(Continued)

*Primary Examiner* — Charles Garber
*Assistant Examiner* — Brigitte Paterson
(74) *Attorney, Agent, or Firm* — Birch, Stewart, Kolasch & Birch, LLP

(57) ABSTRACT

Disclosed are a method of forming a back reflection layer in a solar cell, a composition used therefor, and a solar cell having a back reflection layer formed by the method, which layer has superior heat-resistance and various types of durabilities, and can contribute to improving the conversion rate of solar cells and reliability during long-term use, and which method can form a back reflection layer in a solar cell easily and at low cost. The polyimide resin composition for use in forming a back reflection layer in a solar cell includes an organic solvent, a polyimide resin dissolved in the organic solvent, and light-reflecting particles dispersed in the organic solvent.

17 Claims, 1 Drawing Sheet

(51) Int. Cl.
  *H01L 31/056* (2014.01)
  *C08G 73/10* (2006.01)

(52) U.S. Cl.
  CPC ........ *C08G73/1042* (2013.01); *C08G 73/1046* (2013.01); *C08G 73/1064* (2013.01); *C08G 73/1067* (2013.01); *C08G 73/1071* (2013.01); *C09D 179/08* (2013.01); *H01L 31/056* (2014.12); *C08L 2203/204* (2013.01); *Y02E 10/52* (2013.01); *Y02E 10/547* (2013.01)

(56) References Cited

U.S. PATENT DOCUMENTS

| | | | |
|---|---|---|---|
| 6,107,563 A | | 8/2000 | Nakanishi et al. |
| 6,147,374 A | | 11/2000 | Tanaka et al. |
| 2003/0123002 A1* | | 7/2003 | Kawase ........................ 349/113 |
| 2006/0182901 A1* | | 8/2006 | Takagi ................. B29C 55/005 428/1.31 |
| 2007/0120785 A1* | | 5/2007 | Kimura .......................... 345/82 |
| 2010/0051099 A1* | | 3/2010 | Cheong et al. ................. 136/256 |
| 2011/0132444 A1* | | 6/2011 | Meier et al. ................... 136/255 |
| 2011/0213075 A1 | | 9/2011 | Goshima et al. |

FOREIGN PATENT DOCUMENTS

| | | |
|---|---|---|
| EP | 1 145 845 B1 | 4/2010 |
| JP | 11-135817 A | 5/1999 |
| JP | 2002-270869 A | 9/2002 |
| JP | 2008-172279 A | 7/2008 |
| JP | 2010-056280 A | 3/2010 |
| JP | 2011-159841 A | 8/2011 |
| JP | 2011-178855 A | 9/2011 |
| WO | WO 00/41884 A1 | 7/2000 |
| WO | WO 2009/142938 A1 | 11/2009 |
| WO | WO 2009/143034 A1 | 11/2009 |

OTHER PUBLICATIONS

Brugler et al.; "Integrated Electronics for a Reading Aid for the Blind," IEEE Journal of Solid-State Circuits (1969), vol. 4, No. 6, pp. 304-312 (Abstract).

Takato et al., "Fabrication of Crystalline Silicon Solar Cells with Polyimide Back Reflector," The Japan Society of Applied Physics Gakujutsu Koenkai Koen Yokoshu (Aug. 30, 2010), Dai 71 Kai, 15p-ZB-14, with English translation.

Weimer et al., "Phototransistor arrays of simplified design," IEEE Journal of Solid-State Circuits (1971), vol. 6, No. 3, pp. 135-146 (Abstract).

* cited by examiner

POLYIMIDE RESIN COMPOSITION FOR USE IN FORMING REVERSE REFLECTING LAYER IN PHOTOVOLTAIC CELL AND METHOD OF FORMING REVERSE REFLECTING LAYER IN PHOTOVOLTAIC CELL USED THEREWITH

TECHNICAL FIELD

The present invention relates to a polyimide resin composition for forming a back reflection layer in a solar cell, a method of forming a back reflection layer in a solar cell using the same, and a solar cell having a back reflection layer formed by the method.

BACKGROUND ART

In crystalline silicon solar cells using a single crystalline silicon substrate or a polycrystalline silicon substrate, high efficiency and price reduction thereof are important tasks.

FIG. 1 is a graph showing the structure of a crystalline silicon solar cell which is now mainly used. The mainly used crystalline silicon solar cell is provided with a crystalline silicon substrate 1, a diffusion layer 2, a surface antireflection coating 3, BSF (back surface field) layer 4, a first electrode 5 (an electrode on the light-receiving surface) and a second electrode 6 (an electrode on the back surface).

The electrode on the light-receiving surface (the first electrode 5 in FIG. 1) and the electrode on the back surface (the second electrode 6 in FIG. 1) are formed by coating with silver (Ag) paste and aluminium (Al) paste respectively, and calcining the resultant.

However, the mainly used crystalline silicon solar cells have the problems in that the substrate warps after calcination due to the difference in coefficients of thermal expansion between silicon and aluminum, especially on the back surface, carrier recombination is large and reflectance is small. These problems are obstacles to high efficiency of solar cells. Further, in cases where the thinning of solar cells are to be attempted, these problems are more noticeable obstacles to the high efficiency of solar cells.

As a means for solving such problems, back side contact solar cell structures in which an electrode is not formed on the entire back surface of the crystalline silicon solar cell with Al paste, but formed on parts of the back surface, and other parts of the back surface are covered with backside passivation layer (also referred to as back reflection layer) such as a silicon oxide film or a silicon nitride film (SiN film) are proposed (Non-patent Literatures 1 and 2). However, the means proposed in the Non-patent Literatures 1 and 2 is not preferred in view of the cost, since a contact is provided by holing the film with photolithography and etching after forming a silicon oxide film or a SiN film on the back surface. Moreover, Patent Literature 1 discloses a method using a dicing saw and a method using a laser for providing a contact. However, the method of making contact holes after coating the entire surface with the film has the problem in that the production process is complicated.

The heat-resistant resins represented by polyimide resins have been widely used as surface protective films or interlayer insulation films of semiconductor devices in the field of electronics since they have superior heat resistance and mechanical characteristics. On the other hand, Patent Literatures 3 and 4 describe in detail a method of producing a first passivation layer and second passivation layer formed on the surface of a solar cell. Solar cells are known devices for converting solar radiation to electrical energy. The solar cells can be produced on a semiconductor wafer using semiconductor processing technique.

Further, the improvement of reflectance on the back surface is attained by increasing reflection from passivation layers and electrodes formed with aluminium or silver. For example, in Patent Literature 1, the reflection on the back surface is increased by restricting the thickness of SiN film ("silicon nitride film" in Patent Literature 1) formed on the back surface. However, the SiN film used on the back surface is produced mainly by chemical vapor deposition method (CVD method), so that it has a problem in that the production cost is high.

PRIOR ART REFERENCES

Patent Literatures

Patent Literature 1: JP 2008-172279 A
Patent Literature 2: U.S. Pat. No. 5,053,083
Patent Literature 3: U.S. Pat. No. 4,927,770
Patent Literature 4: WO 00/41884

Non-Patent Literatures

Non-Patent Literature 1: J. S. Brugler et al., "Integrated Electronics for a Reading Aid for the Blind", IEEE Journal of Solid-State Circuits, Vol. SC-4, No. 6, p. 304-312, December, 1969

Non-Patent Literature 2: P. K. Weimer et al., "Phototransistor Array of Simplified Design", p. 135, IEEE Journal of Solid-State Circuits, June 1971

DISCLOSURE OF THE INVENTION

Problems to be Solved by the Invention

An object of the present invention is to provide a method of forming a back reflection layer in a solar cell, which is excellent in heat resistance and various durabilities, and which can contribute to the improvement of conversion rate and reliability in long-term use of solar cells, by which method the back reflection layer in a solar cell can be formed simply at a low cost, as well as to provide a composition for forming the back reflection layer, and a solar cell comprising the back reflection layer formed by the method.

Means for Solving the Problems

The present inventors intensively studied to discover that a back reflection layer of a solar cell which is excellent in heat resistance and various durabilities, in particular, a back reflection layer of a back contact solar cell having a partial contact structure (back side contact solar cell structures) with partial contact holes, in which cell an electrode is partially formed on the back surface of the solar cell, can be formed simply at low cost by forming the back reflection layer with a solvent-soluble polyimide resin composition in which light-reflecting particles are dispersed, thereby completing the present invention.

That is, the present invention has the following constitutions.

(1) A polyimide resin composition for forming a back reflection layer in a solar cell, the composition comprising:
  an organic solvent;
  a polyimide resin dissolved in the organic solvent; and
  light-reflecting particles dispersed in the organic solvent.

(2) The composition according to (1), wherein the light-reflecting particles are white pigment particles.

(3) The composition according to (2), wherein the white pigment particles are at least one metal oxide selected from the group consisting of silica ($SiO_2$), zirconia ($ZrO_2$), alumina ($Al_2O_3$), tantalum(V) oxide ($Ta_2O_5$), titanium oxide ($TiO_2$), zinc oxide ($ZnO_2$) and vanadium dioxide ($VO_2$).

(4) The composition according to any one of (1) to (3), wherein the content of the light-reflecting particles is 1 to 80 parts by weight with respect to 100 parts by weight of the polyimide resin.

(5) The composition according to any one of (1) to (4), the composition comprising:
a mixed solvent of a first organic solvent (A) and a second organic solvent (B); and
a heat-resistant polyimide resin having at least one group selected from the group consisting of alkyl groups and perfluoroalkyl groups in recurring units, and having thixotropic property, the polyimide resin being dissolved in the mixed solvent.

(6) The composition according to (5), wherein each of the alkyl groups and perfluoroalkyl groups has 1 to 4 carbon atoms.

(7) The composition according to (5) or (6), wherein the polyimide resin comprises recurring units represented by the following formula [I]:

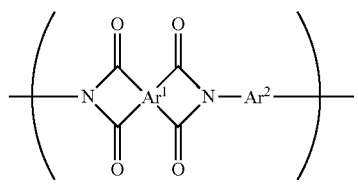

(wherein $Ar^1$ represents an arbitrary tetravalent organic group, $Ar^2$ represents an arbitrary divalent organic group, and at least either one of $Ar^1$ and $Ar^2$ have the alkyl group and/or perfluoroalkyl group).

(8) The composition according to (7), wherein the $Ar^1$ is represented by the following formula [II]:

(wherein T represents —$C(CH_3)_2$— or —$C(CF_3)_2$—).

(9) The composition according to (7) or (8), wherein the $Ar^2$ is represented by the group selected from the group consisting of the following formula [III]:

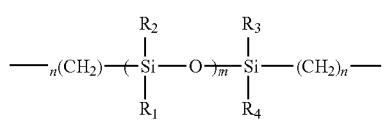

(wherein $R_1$, $R_2$, $R_3$ and $R_4$ independently represent one selected from the group consisting of hydrogen, a hydroxyl group, $C_1$-$C_4$ alkyl group, phenyl group, F, Cl and Br (wherein at least one of $R_1$, $R_2$, $R_3$ and $R_4$ represent a $C_1$-$C_4$ alkyl group), and n and m independently represent an integer of 1 to 10);

the following formula [IV]:

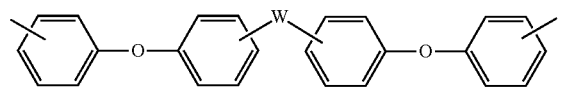

(wherein W represents —$C(CH_3)_2$— or —$C(CF_3)_2$—); and the following formula [V]:

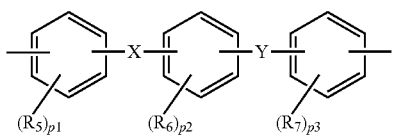

(wherein X and Y are independently selected from the group consisting of —C(=O)—, —$SO_2$—, —O—, —S—, —$(CH_2)_a$— (a represents an integer of 1 to 5), —NHCO—, —$C(CH_3)_2$—, —$C(CF_3)_2$—, —C(=O)O— and a single bond; $R_5$, $R_6$ and $R_7$ are independently selected from the group consisting of hydrogen, a hydroxyl group, $C_1$-$C_4$ alkyl group, phenyl group, F, Cl and Br (wherein at least one of $R_5$, $R_6$, and $R_7$ represent a $C_1$-$C_4$ alkyl group), and p1, p2 and p3 independently represent an integer of 1 to 4).

(10) The composition according to any one of (5) to (9), wherein the polyimide resin contains 1,3-bis(3-aminopropyl)tetramethyldisiloxane in an amount of 0 to 20 mol % based on total diamine components, and has a glass transition temperature of 150° C. or higher.

(11) The composition according to any one of (5) to (10), wherein the organic solvent (A) and the organic solvent (B) have different evaporation rates, and the polyimide has a lower solubility in the organic solvent having a smaller evaporation rate.

(12) The composition according to any one of (5) to (11), wherein the organic solvent (A) is a hydrophobic solvent and has a vapor pressure at room temperature of 1 mmHg or lower, and the organic solvent (B) is a hydrophilic solvent having a vapor pressure at room temperature of 1 mmHg or lower.

(13) The composition according to any one of (5) to (12), which has a viscosity of 20,000 to 200,000 mPa·s at a shear rate of from 1 to 100 $s^{-1}$.

(14) The composition according to any one of (5) to (13), which has a thixotropy coefficient of from 1.5 to 10.0.

(15) A method of forming a back reflection layer in a solar cell, the method comprising coating a base layer on the back surface of the solar cell with the composition according to any one of (1) to (14), and drying the composition to form a polyimide film.

(16) The method according to (15), wherein the polyimide film is formed by screen printing method, ink jet method or dispense method.

(17) The method according to (15) or (16), wherein a polyimide film having a thickness of 1 μm or more after drying is formed by one coating.

(18) The method according to any one of (14) to (17), wherein the solar cell comprises:

a crystalline silicon substrate having a first conductivity type, which is composed of a single crystalline silicon or a polycrystalline silicon;
an impurity-diffused layer having a second conductivity type, which is formed on the light-receiving surface of the crystalline silicon substrate;
a first electrode formed on the surface of the impurity-diffused layer on the light-receiving surface of the crystalline silicon substrate;
a second electrode formed on the back surface of the crystalline silicon substrate; and
a back reflection layer formed on the back surface of the crystalline silicon substrate;
wherein said second electrode provides a contact on the back surface of the crystalline silicon substrate through a plurality of openings of the polyimide ink

(19) The method according to any one of (14) to (17), wherein said solar cell comprises:
a crystalline silicon substrate having a first conductivity type, which is composed of a single crystalline silicon or a polycrystalline silicon;
an impurity-diffused layer having a second conductivity type, which is formed on the light-receiving surface of the crystalline silicon substrate;
a first electrode formed on the surface of the impurity-diffused layer on the light-receiving surface of the crystalline silicon substrate;
a second electrode formed on the back surface of the crystalline silicon substrate; and
an impurity-diffused layer having a first conductivity type, which layer is formed on a part or all of the back surface of the crystalline silicon substrate, and in which layer higher concentrations of impurities than that in the crystalline silicon substrate are added; and
a back reflection layer formed on the surface of the impurity-diffused layer having a first conductivity type;
wherein the second electrode provides a contact on the surface of the impurity-diffused layer on the back surface of the crystalline silicon substrate through a plurality of the openings.

(20) A solar cell comprising the back reflection layer formed by the method according to any one of (14) to (19).

DESCRIPTION OF SYMBOLS

Figure 1:
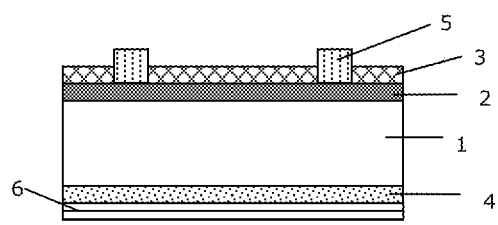
FIG. 1 is a schematic cross-sectional view showing a structure of a conventional solar cell.

1 Crystalline silicon substrate
2 Diffusion layer
3 Surface antireflection coating
4 BSF layer
5 First electrode
6 Second electrode
7 Back reflection layer

MODE FOR CARRYING OUT THE INVENTION

The polyimide resin composition of the present invention is for forming a back reflection layer of a solar cell, and contains an organic solvent, a polyimide resin dissolved in the organic solvent and light-reflecting particles dispersed in the organic solvent. The solvent-soluble polyimide is known as described, for example, in Patent Literature 4, and although the polyimide is not restricted as long as the polyimide is soluble in organic solvents, the preferable polyimides and organic solvents will be described later.

The light-reflecting particles dispersed in an organic solvent are contained in the resin composition of the present invention. The light-reflecting particles are preferably white pigment particles, and preferable examples of the white pigment particles include at least one metal oxide particles selected from the group consisting of silica ($SiO_2$), zirconia ($ZrO_2$), alumina ($Al_2O_3$), tantalum (V) oxide ($Ta_2O_5$), titanium oxide ($TiO_2$), zinc oxide ($ZnO_2$) and vanadium dioxide ($VO_2$). Among these, titanium oxide is especially preferable in view of whiteness and cost.

The content of the light-reflecting particles is preferably 1 to 80 parts by weight, more preferably 10 to 50 parts by weight with respect to 100 parts by weight of the polyimide resin.

As the resin composition of the present invention, one containing a mixed solvent of a first organic solvent (A) and a second organic solvent (B); and a heat-resistant polyimide resin having at least one group selected from the group consisting of alkyl groups and perfluoroalkyl groups (wherein each of the alkyl groups and perfluoroalkyl groups has preferably 1 to 4 carbon atoms) in recurring units, and having thixotropic property, the polyimide resin being dissolved in the mixed solvent is especially preferred. The polyimide resin composition can be applied by screen printing method or dispense method, has excellent rheological characteristics, and has excellent wetting property with substrates and excellent pattern-forming property and continuous printing property. The coating films formed with the resin composition of the present invention can exhibit prominent effects in that the films have excellent adhesion with substrates, and have excellent electric properties, heat-resistance and chemical resistance.

In particular, the following polyimides are preferred in view of the above-mentioned effects.

That is, the polyimides comprising recurring units represented by the following formula [I]:

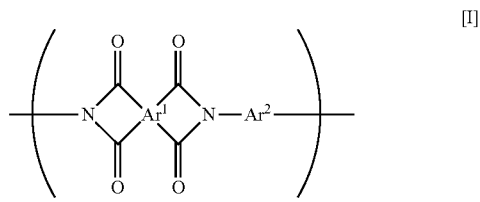

(wherein $Ar^1$ represents an arbitrary tetravalent organic group, $Ar^3$ represents an arbitrary divalent organic group, and at least either one of $Ar^1$ and $Ar^2$ have the alkyl group and/or perfluoroalkyl group) are preferred.

Among the polyimides represented by the formula [I], polyimides having $Ar^1$ represented by the following formula [II] are especially preferred:

(wherein T represents —C(CH$_3$)$_2$— or —C(CF$_3$)$_2$—).

Further, polyimides having Ar$^2$ represented by any one of the following formulae [III] to [V] are preferred:

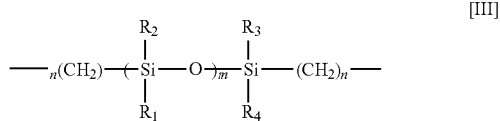

(wherein R$_1$, R$_2$, R$_3$ and R$_4$ independently represent one selected from the group consisting of hydrogen, a hydroxyl group, C$_1$-C$_4$ alkyl group, phenyl group, F, Cl and Br (wherein at least one of R$_1$, R$_2$, R$_3$ and R$_4$ represent a C$_1$-C$_4$ alkyl group), and n and m independently represent an integer of 1 to 10);

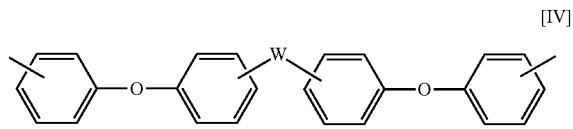

(wherein W represents —C(CH$_3$)$_2$— or —C(CF$_3$)$_2$—);

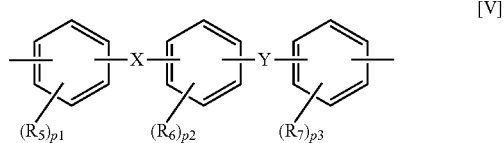

(wherein X and Y are independently selected from the group consisting of —C(=O)—, —SO$_2$—, —O—, —S—, —(CH$_2$)$_a$— (a represents an integer of 1 to 5), —NHCO—, —C(CH$_3$)$_2$—, —C(CF$_3$)$_2$—, —C(=O)O— and a single bond; and R$_5$, R$_6$ and R$_7$ are independently selected from the group consisting of hydrogen, a hydroxyl group, C$_1$-C$_4$ alkyl group, phenyl group, F, Cl and Br (wherein at least one of R$_5$, R$_6$, and R$_7$ represent a C$_1$-C$_4$ alkyl group), and p1, p2 and p3 independently represent an integer of 1 to 4).

Preferred examples of the tetracarboxylic dianhydride containing the structure represented by the above-described formula [II] include 2,2-bis(3,4-dicarboxyphenyl)propane dianhydride and 4,4'-(4,4'-isopropylidenediphenoxy)bisphthalic dianhydride, 2,2-bis(3,4-dicarboxyphenyl)hexafluoropropane dianhydride and 1,4-bis(3,4-dicarboxytrifluorophenoxy)tetrafluorobenzene dianhydride.

R$_1$ to R$_4$ in the formula [III] are C$_1$-C$_{10}$, preferably C$_1$-C$_4$ substituted or unsubstituted monovalent hydrocarbon group, and may be any of an aliphatic hydrocarbon group, alicyclic hydrocarbon group, and aromatic hydrocarbon group. Further, R$_1$ to R$_4$ may be the same or different. Specific examples of the R$_1$ to R$_4$ include an alkyl group such as methyl group, ethyl group, propyl group, isopropyl group, butyl group, isobutyl group, tert-butyl group, pentyl group, hexyl group, heptyl group, or octyl group; and an alkenyl group such as vinyl group, allyl group, propenyl group, isopropenyl group, butenyl group, isobutenyl group, hexenyl group or the like for an aliphatic hydrocarbon group. Examples of the alicyclic hydrocarbon group include a cycloalkyl group such as cyclohexyl group or cyclopentyl group; a cycloalkenyl group such as cyclohexenyl group or the like. Examples of the aromatic hydrocarbon group include an aryl group such as phenyl group, tolyl group or xylyl group; an aralkyl group such as benzyl group, ethyl phenyl group or propyl phenyl group, or the like. The R$_1$ to R$_4$ may be a C$_1$-C$_4$ alkoxy group, alkenoxy group or cycloalkyl group, and specific examples thereof include methoxy group, ethoxy group, propoxy group, isopropoxy group, butoxy group, isobutoxy group, tert-butoxy group, hexyloxy group, cyclohexyloxy group, octoxy group, vinyloxy group, allyloxy group, propenoxy group and isopropenoxy group. Among these, more preferred R$_1$ to R$_4$ are methyl group and phenyl group.

Preferred examples of the diamine containing the structure represented by the above-described formula [IV] include 2,2-bis[4-(4-aminophenoxy)phenyl]propane, 2,2-bis[4-(4-aminophenoxy)phenyl]hexafluoropropane, α,α-bis[4-(4-aminophenoxy)phenyl]-1,3-diisopropylbenzene and α,α-bis[4-(4-aminophenoxy)phenyl]-1,4-diisopropylbenzene.

Preferred examples of the diamine containing the structure represented by the above-described formula [V] include α,α-bis(4-aminophenyl)-1,3-diisopropylbenzene, α,α-bis(4-aminophenyl)-1,3-dihexafluoroisopropylidenebenzene, α,α-bis(4-aminophenyl)-1,4-diisopropylbenzene and α,α-bis(4-aminophenyl)-1,4-dihexafluoroisopropylidenebenzene.

As the tetracarboxylic dianhydride and diamine constituting the polyimide used in the present invention, in addition to the above-described at least one of tetracarboxylic dianhydrides and diamines containing at least one of alkyl groups and perfluoroalkyl groups, one or more of other tetracarboxylic dianhydrides and diamines are usually used in order to give various functions such as heat resistance, electric properties, physical properties of the film, adhesion and the like.

Examples of such tetracarboxylic dianhydride include pyromellitic dianhydride, 3,3',4,4'-biphenyltetracarboxylic dianhydride, bis(3,4-dicarboxyphenyl)ether dianhydride, 3,3',4,4'-benzophenone tetracarboxylic dianhydride, 3,3',4,4'-biphenylsulfone tetracarboxylic dianhydride and bicyclo[2.2.2]oct-7-ene-2,3,5,6-tetracarboxylic dianhydride. Among these tetracarboxylic dianhydrides, bis(3,4-dicarboxyphenyl)ether dianhydride and 3,3',4,4'-biphenylsulfone tetracarboxylic dianhydride can suitably be employed in view of the solubility. These tetracarboxylic dianhydrides may be used individually or two or more of them may be used in combination.

Examples of the diamines include 2,4-diaminotoluene, 4,4'-diamino-2,2'-dimethyl-1,1'-biphenyl, 4,4'-diamino-2,2'-ditrifluoromethyl-1,1'-biphenyl, 4,4'-diamino-3,3'-ditrifluoromethyl-1,1'-biphenyl, m-phenylenediamine, p-phenylenediamine, 4,4'-diamino-3,3'-dihydroxy-1,1'-biphenyl, 4,4'-diamino-3,3'-dimethyl-1,1'-biphenyl, 9,9'-bis(3-methyl-4-aminophenyl)fluorene and 3,7-diamino-dimethyldibenzothiophene 5,5-dioxide, bis(3-carboxy-4-aminophenyl)methylene, 2,2-bis(3-hydroxy-4-aminophenyl)propane, 2,2-bis(4-aminophenyl)propane, 2,2-bis(3-methyl-4-aminophenyl)propane, 3,4'-diaminodiphenyl ether, 4,4'-diaminodiphenyl ether, 3,3'-diaminodiphenyl sulfone, 4,4'-diaminodiphenyl sulfone, 4,4'-diaminodiphenyl sulfide, 3,5-diaminobenzoic acid, 2,6-diaminopyridine, 4,4'-(hexafluoroisopropylidene)dianiline, 2,2-bis(3-amino-4-hydroxyphenyl)hexafluoropropane, 2,2-bis(3-amino-4-methylphenyl)hexafluoropropane, 4,4'-(9-fluorenylidene)

dianiline, 1,3-bis(3-aminophenoxy)benzene, 1,3-bis(3-hydroxy-4-aminophenoxy)benzene, 1,3-bis(4-aminophenoxy)benzene, 1,4-bis(4-aminophenoxy)benzene, 2,2-bis(3-hydroxy-4-aminophenyl)benzene and 2,2-bis(3-methyl-4-aminophenyl)benzene. These diamines may be used individually or two or more of them may be used in combination.

The polyimide used in the present invention is usually obtained by using the above-described at least one of tetracarboxylic dianhydrides and diamines having at least one of alkyl groups and perfluoroalkyl groups, and at least one of the other tetracarboxylic dianhydrides and diamines described above in combination. Among the tetracarboxylic dianhydride components and diamine components constituting the polyimide, the percentage of the components having at least one of alkyl groups and perfluoroalkyl groups is usually from 10 mol % to 80 mol %, preferably 20 mol % to 60 mol %. If the percentage of the components having at least one of alkyl groups and perfluoroalkyl groups is within this range, excellent fine pattern-forming property and adhesion are obtained.

In cases where the substrate is a nitride film, there is a tendency that the adhesion between the aromatic polyimide and the substrate is poor. Therefore, it is preferred to use 1,3-bis(3-aminopropyl)tetramethyldisiloxane as one of the diamine components. This diamine is most preferred because it is commercially available from Shin-Etsu Chemical under the trade name PAM-E and from Toray Dow Corning under the trade name BY16-871. The added amount of this diamine is preferably from 1 mol % to 20 mol %, more preferably from 3 mol % to 15 mol % based on the total diamines. If the amount is more than 20 mol %, there is a tendency that the glass transition temperature of the polyimide resin is too low, and a problem may arise during the continuous operation of the semiconductor substrate at a high temperature.

To promote the chemical resistance, a reactive group may be introduced to the terminal(s) of the polyimide. For example, by adding the tetracarboxylic dianhydride in an amount slightly higher than the required amount, it is possible to make the terminals of the polyimide be the dianhydride. Thereafter, by adding an amine compound typified by 3-ethynylaniline or 4-ethynylaniline, acetyl groups can be introduced to the terminals of the polyimide. Similarly, reactive groups can be introduced by synthesizing the polyimide by adding the diamine compound in an amount slightly higher than the required amount to obtain a polyimide whose terminals are the diamine, and then adding an acid anhydride typified by maleic anhydride, ethynylphthalic anhydride or phenylethynylphthalic anhydride. These terminal groups are reacted under heat at a temperature of 150° C. or higher so as to crosslink the polymer main chain.

The polyimide contained in the polyimide resin composition of the present invention can be produced by a known method in which the tetracarboxylic dianhydride and the diamine are dissolved in an organic solvent and they are directly imidized in the presence of an acid catalyst. The polyimide can also be produced by reacting the tetracarboxylic dianhydride with the diamine in the organic solvent, then adding at least one of a tetracarboxylic dianhydride and a diamine, and carrying out imidization. The mixing ratio of the tetracarboxylic dianhydride to the diamine is preferably such that the total amount of the diamines is 0.9 to 1.1 mol per 1 mol of the total amount of the tetracarboxylic dianhydrides. As the acid catalyst, a catalyst such as acetic anhydride/triethylamine system, valerolactone/pyridine system or the like for chemical imidization may preferably be employed. The reaction temperature is preferably from 80° C. to 250° C., and the reaction time can be appropriately selected depending on the scale of the batch and the reaction conditions employed. Further, block polyimide copolymers obtained by dividing the imidization reaction into two or more steps, and reacting different tetracarboxylic dianhydrides and/or diamines in the respective steps, may preferably be employed. The production processes per se of the solvent-soluble block polyimide copolymers are known as described in, for example, Patent Literature 7, and the polyimide suitably used in the present invention can be synthesized by a known method using the above-described tetracarboxylic dianhydride(s) and/or diamine(s).

The number average molecular weight of the thus obtained polyimide resin is preferably 6,000 to 60,000, more preferably 7,000 to 40,000. If the number average molecular weight is less than 6,000, the physical properties of the film such as breaking strength are tend to be degraded, and if it is more than 60,000, the viscosity is high and so the problem of cobwebbing arises, so that it is difficult to obtain a varnish suited for printing and coating. The number average molecular weight herein means the one in terms of polystyrene based on the calibration curve prepared with a gel permeation chromatography (GPC) apparatus using standard polystyrenes.

The solvent contained in the composition of the present invention is a mixed solvent of a first organic solvent (A) and a second organic solvent (B). It is most preferred that the solvents have different evaporation rates, and the solubility of the polyimide in the solvent having a lower evaporation rate is lower than in the solvent having a higher evaporation rate. If these are satisfied, the sagging of the pattern during drying can be avoided, and so the pattern immediately after the coating can be retained. Since the solubilities in various solvents differ depending on the composition of the polyimide, it is not restricted whether the organic solvent (A) or organic solvent (B) has a higher evaporation rate. The evaporation rate of the solvents can be measured by using a commercially available differential thermogravimetric simultaneous analyzer and measuring the weight loss. In the Examples below, the evaporation rate is measured by using TG-DTA 2000S commercially available from MAC. Science Co., Ltd., under the conditions of: $N_2$ flow rate: 150 ml/min; temperature: 40° C., sample amount: 20 μL; the sample is dropped onto a cup having an opening with a diameter of 5 mm.

The first organic solvent (A) is preferably a hydrophobic solvent (that is, a solvent practically insoluble in water), and preferably is a solvent having a vapor pressure at room temperature of 1 mmHg or lower. Specific examples of the first organic solvent (A) include benzoic acid esters such as methyl benzoate and ethyl benzoate; acetic acid esters such as benzyl acetate, butyl carbitol acetate; and ethers such as diethyleneglycol dibutyl ether. By using a solvent practically insoluble in water, whitening (precipitation phenomenon of polyimide) and viscosity change due to moisture absorption hardly occur especially in the screen printing. Further, if the vapor pressure at room temperature is higher than 1 mm Hg, the screen tends to be dried in the screen printing, so that the continuous printing property tends to be degraded.

The second organic solvent (B) is preferably a hydrophilic solvent (that is, a solvent miscible with water), and preferably is a solvent having a vapor pressure at room temperature of 1 mmHg or lower. Specific examples of the second organic solvent (B) include acetic acid esters such as diethylene glycol monoethyl ether acetate; glymes such as triglyme and tetraglyme; ethers such as tripropylene glycol dimethyl ether and diethylene glycol diethyl ether; and sulfolane. The term "miscible with water" is used for clearly indicating that a solvent having a vapor pressure and properties different from those of the first organic solvent (A) is used, and the second solvent (B) is not necessarily mixed with water. However, since good solvent varies depending on the various starting materials and the composition of the synthesized polyimide, the solvent to be combined with the practically water-insoluble organic solvent (A) is preferably a water-miscible solvent because the freedom of selection is larger. The reason why the vapor pressure of the organic solvent (B) at room temperature is 1 mmHg or lower is the same as described above for the organic solvent (A).

The mixing ratio of the first organic solvent (A) to the second organic solvent (B) is preferably such that the percentage of the first organic solvent (A) is from 30% by weight to 80% by weight based on the whole mixed solvent. If the percentage of the first organic solvent (A) is less than 30% by weight, the hydrophobicity of the solvent is not sufficient, so that whitening and viscosity change during the screen printing tend to occur.

To control the evaporation rate or to adjust the viscosity during the preparation of the resin composition, a diluent may also be used. Examples of the diluent include lactone solvents such as γ-butyrolactone; ketone solvents such as cyclohexanone; carbonate solvents such as ethylene carbonate and propylene carbonate. Using a diluent is effective especially in cases where the pattern to be formed is sufficiently large or the continuous printing property need not be so high, because the solubility of the polyimide is increased and the storage stability is improved. The most recommended solvent is γ-butyrolactone, and this solvent may also be used in the synthesis of the polyimide.

The content of the polyimide resin solid in the composition of the present invention is preferably from 15% to 60% by weight, more preferably from 25% to 50% by weight. If the solid content is less than 15% by weight, the thickness of the film which can be formed by the printing and coating in one time is small, so that two or more times of printing and coating tend to be required. If the solid content is more than 60% by weight, the viscosity of the resin composition tends to be too high.

As described later, the resin composition of the present invention has a thixotropic property. Since the thixotropic property can be given by adding an inorganic filler, it is effective to add an inorganic filler to the resin composition of the present invention. Examples of the inorganic filler for giving thixotropic property include at least one of silica, alumina and titania. More specifically, examples of the inorganic filler include at least one of amorphous silica with a size of 0.01 μm to 0.03 μm and spherical silica, alumina and titania with a diameter of 0.1 μm to 0.3 μm. To promote storage stability and the like, it is preferred to use an inorganic filler treated with a trimethylsilylating agent. The content of the inorganic filler in the composition is usually 0% to 50% by weight, preferably 2% to 30% by weight. If the content of the inorganic filler is within this range, appropriate thixotropic property is imparted.

A metal oxide filler may be added to the polyimide resin composition of the present invention as a white pigment having an effect to reflect light. Examples of the oxide to be used include silica ($SiO_2$), zirconia ($ZrO_2$), alumina ($Al_2O_3$), tantalum(V) oxide ($Ta_2O_5$), titanium oxide ($TiO_2$), zinc oxide ($ZnO_2$) and vanadium dioxide ($VO_2$), and concretely a metal oxide having a particle size of 0.01 to 0.3 μm. Further, to promote dispersity, storage stability and the like, it is preferred to use an inorganic metal oxide filler treated with a trimethylsilylating agent. The content of the inorganic filler in the composition is typically 2 to 100% by weight, preferably 10 to 50% by weight. If the content of the inorganic filler is within this range, an appropriate effect to reflect light is imparted.

Additives such as a coloring agent, antifoaming agent, leveling agent, adhesion-promoting agent and the like may be added to the polyimide resin composition of the present invention as long as the product is not adversely affected. Examples of the coloring agent include phthalocyanine blue, phthalocyanine green, iodine green, disazo yellow, crystal violet, titanium oxide, carbon black and naphthalene black. Antifoaming agents are used for extinguishing the foams generated in the printing, coating and curing steps. As the antifoaming agent, surfactants such as acrylic surfactants and silicone surfactants may be employed. Examples of the antifoaming agent include BYK-A501 of BYK Chemi; DC-1400 of Dow Corning; and silicone antifoaming agents such as SAG-30, FZ-328, FZ-2191 and FZ-5609 of Nippon Unicar Co., Ltd. Leveling agents are used for eliminating the irregularities on the surface of the coating layer, which irregularities are formed during the printing and coating. More particularly, a surfactant in an amount of about 100 ppm to about 2% by weight is preferably added. By adding an acrylic, silicone or the like leveling agent, generation of foams can be reduced and the coating layer can be smoothened. Preferred leveling agents are anionic one not containing ionic impurities. Appropriate examples of the surfactant include FC-430 of 3M; BYK-051 of BYK Chemi; and Y-5187, A-1310 and SS-2801 to 2805 of Nippon Unicar Co., Ltd. Examples of the adhesion-promoting agent include imidazole compounds, thiazole compounds, triazole compounds, organic aluminum compounds, organic titanium compounds and silane coupling agents. The additives described above are preferably contained in an amount of 10 parts by weight or less based on 100 parts by weight of the polyimide resin component. If the amount of the above-described additives is more than 10 parts by weight, the physical properties of the obtained film tend to be degraded, and a problem of the pollution by the volatile components arises. Therefore, it is most preferred not to add the above-described additives.

The viscosity at 25° C. of the polyimide resin composition of the present invention is preferably 3,500 to 30,000 mPa·s, more preferably 4,000 to 20,000 mPa·s, still more preferably 6,000 to 18,000 mPa·s. If the viscosity is less than 3,500 mPa·s, sagging or the like is likely to occur, and a sufficient film thickness and resolution cannot be obtained. If the viscosity is higher than 40,000 mPa·s, transferring property and ease of handling in printing tend to be degraded. The value of the viscosity is expressed in terms of apparent viscosity measured by using a rheometer at a revolution of 333 rad/s.

The value of the viscosity is important for not only retaining the shape of the coating layer immediately after coating, but also for the flowability, that is, the property to be easily deformed and flowed by the squeegee during the screen printing. In the screen printing, if the viscosity is high, the rolling of the resin composition may be hindered, so that the coating with a scraper may be insufficient and irregularities in coating and deformation tend to easily occur.

If an ink does not have a shape-retaining property to retain the shape of the coating layer immediately after coating in a desired pattern by the screen printing or the like, blur and sagging occur in the circumference of the pattern occurs, so that a thick film cannot be formed with a high resolution. By simply increasing the viscosity, although the sagging or the like can be inhibited, the problem in the detachment from the screen in the screen printing and problem in the irregularities in the coating film arise. Thus, to prevent the generation of blur and sagging, thixotropy coefficient is important.

Although the thixotropic property can be quantified and evaluated from the obtained area of a hysteresis curve measured by a rheometer (measurement of the revolution dependence of the viscosity), it is simplest to evaluate the thixotropic property by the TI value measured by an ordinary viscometer. In the present invention, the thixotropy coefficient is expressed by $\eta 33/\eta 33$ which is a ratio of apparent viscosity ($\eta 33$) of the resin composition at a shear rate of 33 (rad/s) to the apparent viscosity ($\eta 333$) at 333 (rad/s).

The resin varnish preferably has a complex viscosity measured at a frequency of 33 rad/s of from 14,000 to 120,000 mPa·s. If the complex viscosity is higher than 120,000 mPa·s, the paste may remain in the mesh of the screen after the screen printing, and the detachment from the screen tends to be bad.

Therefore, it is preferred to adjust the thixotropy coefficient ($\eta 33/\eta 333$) at 25° C. of the polyimide resin composition of the present invention within the range from 1.5 to 4.0, more preferably from 1.8 to 3.5, still more preferably from 2.5 to 3.2. If the thixotropy coefficient is 1.5 or more, sufficient resolution may easily be obtained in the screen printing. On the other hand, if the thixotropy coefficient is 4.0 or lower, the ease of handling during printing is promoted.

The polyimide resin composition of the present invention preferably has a good wetting property to silicon wafers, ceramic substrates, glass substrates, glass epoxy substrates, metal substrates typified by Ni, Cu and Al substrates, and PI coating substrates. That is, any of the contact angles at room temperature on the surface of any of silicon, $SiO_2$ film, polyimide resin, ceramic and metal is preferably 20° to 90°. If the contact angle is 90° or less, a uniform coating film free from blisters, cissing and pinholes can be obtained. If the contact angle is more than 90°, the resin paste is repelled on the substrate, so that pinholes and defective patterning may occur. On the other hand, if the contact angle is less than 20°, sagging may occur during the leveling after coating, so that the precision of the patterning tends to be degraded, which is not preferred. The contact angle is defined as the angle between the tangent line and the substrate, which tangent line is drawn from the contact point when a drop of the heat-resistant resin paste is dropped on the substrate. The term "room temperature" mainly indicate a temperature of about 25° C. The contact angle of the composition can be adjusted by one or more of the composition of the polyimide resin, solvent, surfactant, antifoaming agent and leveling agent.

The back reflection layer in a solar cell can be formed by coating a back surface of the solar cell with the polyimide composition of the present invention, and drying the composition. As the method of coating the polyimide resin composition of the present invention, screen printing method, dispense method and ink jet method are preferred. Among these, screen printing method is most preferred because a large area can be coated in a short time. It is possible to form a film having a thickness of 1 μm or more, preferably 2 μm or more, stably after drying by one coating. In view of the reliability of insulation, it is preferred to attain a film thickness of at least 5 μm by one coating. Therefore, in screen printing method, it is preferred to carry out the screen printing using a mesh screen having a line diameter of 50 μm or less and a mesh size of not smaller than 420 mesh, and using a squeegee made of a resin having a rubber hardness of not less than 70° and not more than 90°. The specification of the screen such as mesh diameter and number of mesh may appropriately be selected depending on the desired thickness of the film and pattern size. By the dispense method, thin line can be drawn, and the line thickness after allowing the wet coating film to stand at room temperature for one day can be made within the range of ±20% from the line thickness immediately after coating. Further, by the ink jet method, thin line can be drawn, and the line thickness after allowing the wet coating film to stand at room temperature for one day can be made within the range of ±100% from the line thickness immediately after coating.

By performing leveling, vacuum drying and the final curing steps on the polyimide resin composition after printing, insulation films and protective films having excellent electric properties, heat resistance and chemical resistance can be obtained. The leveling is performed preferably for 10 minutes or more. Although the vacuum drying is preferably performed because good finishing of the coating film can be attained, in cases where a leveling agent or an antifoaming agent is added, vacuum drying may not be necessary. The curing temperature and time of the final curing step may be appropriately selected depending on the solvent of the polyimide resin composition and the thickness of the coated film.

The solar cell to which the method of the present invention is applied is not restricted as long as the solar cell has a back reflection layer. However, in order to take advantages of the present invention that the patterned polyimide film can be formed simply by screen printing method, ink jet method or dispense method, it is especially advantageous that the present invention is applied to a back contact solar cell having a partial contact structure with partial contact holes, in which cell an electrode is partially formed on the backside of the solar cell.

That is, as the solar cell, one having:

a crystalline silicon substrate having a first conductivity type, which is composed of a single crystalline silicon or a polycrystalline silicon;

an impurity-diffused layer having a second conductivity type, which is formed on the light-receiving surface of the crystalline silicon substrate;

a first electrode formed on the surface of the impurity-diffused layer on the light-receiving surface of the crystalline silicon substrate;

a second electrode formed on the back surface of the crystalline silicon substrate; and a back reflection layer formed on the back surface of the crystalline silicon substrate;

wherein the second electrode provides a contact on the back surface of the crystalline silicon substrate through a plurality of openings of the polyimide ink, is preferred.

Further, as the solar cell, one having:

a crystalline silicon substrate having a first conductivity type, which is composed of a single crystalline silicon or a polycrystalline silicon;

an impurity-diffused layer having a second conductivity type, which is formed on the light-receiving surface of the crystalline silicon substrate;

a first electrode formed on the surface of the impurity-diffused layer on the light-receiving surface of the crystalline silicon substrate;

a second electrode formed on the back surface of the crystalline silicon substrate; and an impurity-diffused layer having a first conductivity type, which layer is formed on a part or all of the back surface of the crystalline silicon substrate, and in which layer higher concentrations of impurities than that in the crystalline silicon substrate are added; and a back reflection layer formed on the surface of the impurity-diffused layer having a first conductivity type;

wherein the second electrode provides a contact on the surface of the impurity-diffused layer on the back surface of the crystalline silicon substrate through a plurality of the openings, is also preferred. The preferable solar cells will now be described in more detail below.

Figure 2:
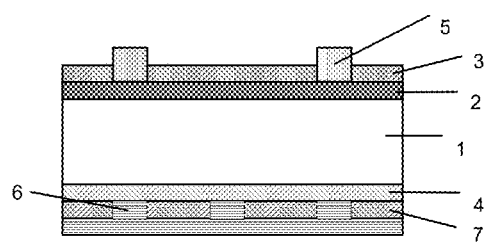
FIG. 2 is a cross-sectional view showing an example of the cross-section structure of the solar cell according to the present invention.

The preferable structures of the solar cells will now be described based on FIGS. 2 and 3. FIG. 2 is a cross-sectional view showing an example of the cross-sectional structure of the solar cell in an embodiment of the present invention (hereinafter referred to as "the present embodiment").

As the crystalline silicon substrate 1 used in the present invention, either of a single crystalline silicon or a polycrystalline silicon may be used, and either of a crystalline silicon having a p-conductivity type or a crystalline silicon having a n-conductivity type may be used. An example using a p-type single crystalline silicon for the crystalline silicon substrate 1 in the present embodiment will now be described below. Although the single crystalline silicon or polycrystalline silicon used for the crystalline silicon substrate 1 may be an arbitrary one, the single crystalline silicon or polycrystalline silicon having a resistivity of 0.5 to 10 Ω·cm is preferred.

An n-type diffusion layer 2 in which a V-group element such as phosphorus is doped, is formed on the light-receiving surface of the p-type crystalline silicon substrate 1, and a pn junction is formed between the crystalline silicon substrate 1 and the diffusion layer 2. A surface antireflection coating 3 (also called passivation layer) such as a SiN film and a first electrode 5 (the electrode on the light-receiving surface) using Ag or the like are formed on the surface of the diffusion layer 2.

The present invention can be applied to the solar cell whether the surface antireflection coating 3 is present or not. Although an irregular structure (textured structure) may be preferably formed on the light-receiving surface of the solar cell to reduce reflectance on the surface, the present invention can be applied to the solar cell whether the textured structure is present or not.

On the other hand, a BSF layer 4 in which a III-group element such as aluminium or boron is doped, is formed on the back surface of the crystalline silicon substrate 1. However, the present invention can be applied to the solar cell whether the BSF layer 4 is present or not.

To provide a contact on the BSF layer 4 (on the back surface of the crystalline silicon substrate 1 when the BSF layer is absent), a second electrode 6 (the backside electrode) composed of aluminium or the like is formed on the backside of the crystalline silicon substrate 1.

Further, in the present embodiment, a back reflection layer 7 composed of a polyimide or polyamideimide is formed in the areas except the contact regions between the BSF layer 4 (the back surface of the crystalline silicon substrate 1 in the absence of the BSF layer) and the second electrode 6. Since the light entering from the light-receiving surface is reflected by the back reflection layer 7, a small number of carriers can be more trapped in the substrate, when compared with the cell shown in FIG. 1. Therefore, it is expected that short-circuit current is increased and efficiency is promoted.

Figure 3:
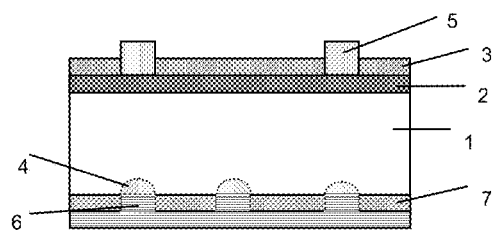
FIG. 3 is a cross-sectional view showing another example of the cross-section structure of the solar cell according to the present invention.

Similar effects can be attained in the solar cell in which the BSF layer 4 is formed only in the partial areas of the back surface including the contact regions between the BSF layer 4 and the second electrode 6, and in which the BSF layer 4 is not formed on the entire back surface as shown in FIG. 3, as another mode of the solar cell structure of the present invention shown in FIG. 2. Since the solar cell shown in FIG. 3 has a small area of the high concentration BSF layer 4, it can attain higher efficiency than that in the solar cell shown in FIG. 2.

Furthermore, although the backside electrode 6 is formed on the entire surface of the contact regions and the back reflection layer 7 in FIGS. 2 and 3, similar effects can be attained by the solar cell in which the backside electrode 6 is formed only in the contact regions or only in the partial areas of the contact regions and the polyimide layer.

Next, although an example of the method of producing the solar cell of the present invention having the above-mentioned constitutions will now be described, the present invention is not restricted to the solar cell produced by the method described below.

Firstly, a textured structure is formed on the surface of the crystalline silicon substrate 1 (hereinafter also referred to as "substrate 1"). The textured structure may be formed on both sides or only on one side (on the light-receiving surface) of the substrate 1. To form the textured structure, the substrate 1 is first immersed in heated potassium hydroxide solution or sodium hydroxide solution to remove the damaged layer of the substrate 1. Then, the substrate 1 is immersed in a solution containing potassium hydroxide/isopropyl alcohol as main components to form the textured structure on both sides or on one side (on the light-receiving surface) of the substrate 1. As described above, since the present invention can be applied to the solar cell whether the textured structure is present or not, this step may be omitted.

Thereafter, the above-described substrate 1 is washed with a solution such as hydrochloric acid solution, hydrofluoric acid solution or the like, and then a phosphorus diffusion layer (n+ layer) (the diffusion layer 2) is formed on the crystalline silicon substrate 1 by thermal diffusion using $POCl_3$. The phosphorus diffusion layer may also be formed by coating the substrate 1 with a solution containing phosphorus and heating the resultant. Although the phosphorus diffusion layer may be formed arbitrarily by a well-known method, the phosphorus diffusion layer is preferably formed such that the thickness thereof is within the range of 0.2 and 0.5 μm, and the sheet resistance is within the range of 40 and 100Ω/□ (ohm/square).

In cases where the textured structure is not formed on both sides or on one side (on the light-receiving surface) of the substrate 1, the production of the solar cell of the present embodiment starts by immersing the substrate 1 in a heated potassium hydroxide solution or sodium hydroxide solution to remove the damaged layer of the substrate 1, and then forming the phosphorus diffusion layer (n+ layer) (diffusion layer 2).

Thereafter, the silicon nitride film as the surface antireflection coating 3 is formed on the diffusion layer 2. Although the surface antireflection coating 3 may be formed arbitrarily by a well-known method, the surface antireflection coating is preferably formed such that the thickness thereof is within the range of 60 and 100 nm, and the refractive index is within the range of 1.9 and 2.2. The surface antireflection coating 3 is not restricted to silicon nitride film, and silicon oxide, aluminium oxide, titanium oxide and the like may be used. The silicon nitride film may be formed by the method such as plasma CVD or thermal CVD, and the plasma CVD is preferred since the film can be formed at a temperature range of 350 and 500° C. Since the present invention can be applied to the solar cell whether the surface antireflection coating 3 is present or not as mentioned above, this step may be omitted.

Then, the back surface of the substrate 1 is coated with a solution such as a paste containing aluminium as a main component, and the resultant is heated to form the backside BSF layer 4. The methods such as screen printing, ink jet, dispense and spin coating can be used for the coating. After heat treatment, an aluminium layer formed on the back surface is removed with hydrochloric acid or the like to form the BSF layer 4. Although the BSF layer 4 may be formed arbitrarily by a well-known method, the BSF layer is preferably formed in the form of a dot or a line by using aluminium in a concentration of $10^{18}$ to $10^{22}$ cm$^{-3}$. Since the present invention can be applied to the solar cell whether the BSF layer 4 is present or not as mentioned above, this step may be omitted.

Next, the first electrode 5 which is the electrode on the light-receiving surface is formed. The first electrode 5 is formed by coating the surface antireflection coating 3 with the paste containing silver as a main component by screen printing, and heating the resultant (fire through). The first electrode 5 may be in an arbitrary shape, and for example, a well-known shape composed of a bus bar electrode and a finger electrode. The heat treatment in forming the BSF layer 4 and the first electrode 5 may be carried out at the same time. In this case, the aluminium layer formed on the back surface after the heat treatment is removed with hydrochloric acid or the like.

Subsequently, the back reflection layer 7 is formed. The back reflection layer 7 is formed, for example, by removing the oxide film formed on the back surface with hydrofluoric acid, and coating with a polyimide composition recited in claims 1 to 7 by the printing method such as screen printing, offset printing, ink jet printing or printing with a dispenser, in a predetermined pattern including contact holes. After coating with the polyimide composition recited in claims 1 to 9, the composition is preferably annealed in the range of 100 to 400° C. to evaporate the solvent. The polyimide composition recited in claims 1 to 9 preferably contains a white pigment having an effect to reflect light, such as titanium oxide, aluminium oxide, zinc oxide, zirconium oxide, calcium oxide, silicon oxide or barium sulfate. Further, the shape of the contact holes is preferably the same as that of the BSF layer 4.

Finally, the second electrode 6 which is the electrode on the backside is formed. The second electrode 6 can be formed by carrying out the screen printing, dispensing or vapor deposition of aluminium, silver or the like, and a paste containing aluminium or silver as a main component, which paste can be calcined at a low temperature of 100 to 350° C., is preferably used. The shape of the second electrode 6 is preferably the same as that of the BSF layer 4, or the entire surface of the backside, comb-like or lattice-like.

Although, in the above description, structural examples and production examples using the p-type crystalline silicon were shown, a n-type crystalline silicon substrate can also be used for the crystalline silicon substrate 1. In this case, the diffusion layer 2 is composed of the layer in which a III-group element such as boron is doped, and the BSF layer 4 is composed of the layer in which a V-group element such as phosphorus is doped.

Further, in the above description, although structural examples and production examples using the single crystalline silicon were shown, a polycrystalline silicon can be used for the crystalline silicon substrate 1. In this case, no change exists.

EXAMPLES

The present invention will now be described concretely by way of Examples, but the present invention is not restricted to these Examples.

1. Syntheses of Polyimides

Synthesis Example 1

To a 2L three-necked separable flask attached with a stainless steel anchor agitator, a ball condenser equipped with a water separation trap was attached. To the flask, 148.91 g (480 mmol) of bis-(3,4-dicarboxyphenyl)ether dianhydride (ODPA), 23.86 g (96 mmol) of 1,3-bis(3-aminopropyl)tetramethyldisiloxane (PAM-E), 70.28 g (204 mmol) of 4,4-(1,3-phenylenediisopropylidene)bisaniline (Bisaniline-M), 73.89 g (180 mmol) of 2,2-bis[4-(4-aminophenoxy)phenyl]propane (BAPP), 4.8 g of γ-valerolactone, 7.6 g of pyridine, 385 g of methyl benzoate (BAME), 385 g of tetraglyme and 100 g of toluene were added. After stirring the mixture at room temperature under a nitrogen atmosphere at 180 rpm for 30 minutes, the mixture was heated to 180° C. and stirred at this temperature for 5 hours. During the reaction, toluene-water azeotrope was removed. By removing the refluxed materials, a polyimide solution with a concentration of 28% by weight was obtained.

Synthesis Example 2

The same apparatus as used in Synthesis Example 1 was used. To the flask, 148.91 g (480 mmol) of ODPA, 29.82 g (120 mmol) of PAM-E, 74.41 g (216 mmol) of Bisaniline-M, 59.11 g (144 mmol) of BAPP, 4.8 g of γ-valerolactone, 7.6 g of pyridine, 303 g of ethyl benzoate (BAEE), 455 g of tetraglyme and 100 g of toluene were added. After stirring the mixture at room temperature under a nitrogen atmosphere at 180 rpm for 30 minutes, the mixture was heated to 180° C. and stirred at this temperature for 5 hours. During the reaction, toluene-water azeotrope was removed. By removing the refluxed materials, a polyimide solution with a concentration of 28% by weight was obtained Synthesis Example 3

The same apparatus as used in Synthesis Example 1 was used. To the flask, 71.66 g (200 mmol) of 3,3',4,4'-biphenylsulfone tetracarboxylic dianhydride (DSDA), 24.85 g (100 mmol) of PAM-E, 65 g of BAME, 98 g of tetraglyme, 4.0 g of γ-valerolactone, 6.3 g of pyridine and 50 g of toluene were added. After stirring the mixture at room temperature under a nitrogen atmosphere at 180 rpm for 30 minutes, the mixture was heated to 180° C. and stirred at this temperature for 1 hour. During the reaction, toluene-water azeotrope was removed. The mixture was then cooled to room temperature, and 71.66 g (200 mmol) of DSDA, 48.04 g (150 mmol) of 4,4'-diamino-2,2'-ditrifluoromethyl-1,1'-biphenyl (TFMB), 61.58 g (150 mmol) of BAPP, 130 g of BAME, 196 g of tetraglyme and 50 g of toluene were added. The mixture was allowed to react for 4 hours at 180° C. with stirring at 180 rpm. By removing the refluxed materials, a polyimide solution with a concentration of 35% by weight was obtained.

2. Preparation of Polyimide Ink Compositions

Compositions containing each one of the polyimides obtained as described above, respectively, were prepared. To 50 g of the copolymer polyimide solution (the solution of Synthesis Examples 1 to 3 (28% by weight)) (the weight of the copolymer polyimide resin component is 14 g), titanium oxide (SJR-600M produced by Tayca Corporation) was added (15% by weight based on polyimide resin), and methyl (ethyl)benzoate as the organic solvent (A) and tetraglyme as the organic solvent (B) were added thereto. The vapor pressures of the organic solvent (A) and the organic solvent (B) at room temperature are 0.38 mmHg (25° C.) and 0.01 mmHg or lower (20° C.), respectively. The evaporation rates are 2256.3 mg/min/m$^2$ and 71.6 mg/min/m$^2$, respectively. The solubilities of the polyimides used in the present invention were larger in the organic solvent (A) than in the organic solvent (B). Thus, the solubility of the polyimide is lower in the solvent having a lower evaporation rate, which is preferred. As for the kneading method, TK Hivis Disper Mix 3D-5 type manufactured by Tokushu Kika Kogyo was used to carry out the kneading. With respect to 100 part of the polyimide resin, 40 part of titanium oxide, 19.3 part of methyl benzoate and 23.6 part of tetraglyme were used. The specific compositions of the prepared compositions are described below.

TABLE 1

| Example | Varnish Synthesis Example | Polyimide solids concentration (%) | SJR-600M (TiO$_2$) (part) | Methyl (ethyl) benzoate (part) | Tetraglyme (part) |
|---|---|---|---|---|---|
| 1 | 1 | 28 | 40 | 19.3 | 23.6 |
| 2 | 2 | 28 | 40 | 12.8 | 30.0 |
| 3 | 3 | 28 | 40 | 17.1 | 25.7 |

3. Film Formation

Films were formed on substrates using the above-described compositions, respectively. The substrate was a silicon wafer and each composition was applied by screen printing method. As for the specific coating conditions, the printing was performed using polyester mesh #420 and a squeegee having a hardness of 80°, at an attack angle of 70°, with a clearance of 2.5 mm, under a printing pressure of 0.15 MPa at a printing rate of 260 mm/sec. Each coating film was dried to form a polyimide film. The drying was performed by conducting leveling for 10 minutes, heating under a nitrogen atmosphere at 140° C. for 10 minutes, and then at 250° C. for 30 minutes under the same atmosphere. The film thickness after drying was 5 µm.

4. Evaluation

The properties of the above-described polyimides, compositions and formed films were evaluated. The evaluations were carried out as follows:
(a) Molecular Weight The number average molecular weight Mn of the modified polyimide resin was measured by gel permeation chromatography (GPC) using HLC-8220GPC (commercially available from Tosoh Corporation). As the column, TSKgel GMH$_{HR}$-H commercially available from Tosoh Corporation was used. As the carrier solvent, LiBr solution in DMF at a concentration of 0.1N was used. The molecular weight is one calculated using standard polystyrenes (TSK standard polystyrenes).
(b) Thermal Properties Thermal decomposition initiation temperature of the polyimide resin was measured by DuPont 951 thermogravimetry apparatus.
(c) Mechanical Properties Mechanical properties of the polyimide resin were measured as follows: That is, a copper foil F2-WS (18 µm) commercially available from Furukawa Circuit Foil Co., Ltd. was coated with the polyimide composition by screen printing, to a thickness after drying of 15±2 µm, and the thus obtained thin film was heated at 120° C. for 10 minutes and then at 180° C. for 30 minutes, thereby attaining drying and heat treatment, followed by removal of the copper foil by etching. The thus obtained polyimide resin film was measured for breaking strength, tensile elongation and initial elastic modulus by a universal tensile tester (Tensilon UTM-11-20, commercially available from Orientec).

(d) Viscosity and thixotropy coefficient were measured using Rheometer RS300 commercially available from Thermo Haake. More particularly, the measurements were carried out as follows: That is, after adjusting the temperature of a plate (stationary part) to 25±0.1° C., a sample in an amount of 1.0 g to 2.0 g was placed thereon. A cone (movable part) was moved to a prescribed position and the resin solution was held until the temperature thereof reached 25±0.1° C., under the condition such that the resin solution was sandwiched between the plate and the cone. Then the cone was started to revolute, and the revolution rate was gradually increased such that the shear rate reached to 33 rad/s in 10 seconds. This revolution velocity was kept and the viscosity after one minute was read. The revolution rate was further increased such that the shear rate reached 333 rad/s from 33 rad/s in 10 seconds, and the viscosity at 333 rad/s was read. The thus obtained value at the 33 rad/s was defined as the viscosity, and the ratio of the value at 323 rad/s was defined as the thixotropy coefficient.

(f) Printing property was evaluated by carrying out printing on the entire surface of a 6-inch silicon wafer using a printer LS-34TVA commercially available from Newlong Seimitsu Kogyo Co., Ltd. and L-Screen, Screen Polyester Mesh #420-27 commercially available from NBC Inc., and the number of cissing was counted by visual observation.

(g) Continuous printing property was evaluated as follows: Printing was performed using the apparatuses used in (f) described above. After carrying out the printing three times, the printing was stopped for 20 minutes. The printing was started again and the compositions with which the film thickness reached to the same thickness as that obtained before stopping within three times were evaluated as good (expressed as "○" in Table 1).

(h) Adhesion with the substrate was evaluated by the cross cut method according to JIS K5600-5-6.

TABLE 2

| Items | Unit | Example 1 | Example 2 | Example 3 |
|---|---|---|---|---|
| Molecular weight | Mn | 51000 | 53000 | 55000 |
| Glass transition temperature (Tg) | ° C. | 172.5 | 167 | 219 |
| Thermal decomposition temperature (Td5%) | ° C. | 493.5 | 508 | 469 |
| Breaking strength | MPa | 70 | 75 | 107 |
| Tensile elongation | % | 14.0 | 9.1 | 12.2 |
| Elastic modulus | GPa | 2.24 | 2.4 | 2.6 |
| Viscosity | mPa·s | 24000 | 32000 | 53000 |
| Thixotropic coefficient | — | 2.2 | 3.2 | 3.6 |
| Printing property  Cissing | — | ○ | ○ | ○ |
| Continuous printing property | — | ○ | ○ | ○ |
| Adhesion (to SiO$_2$) | — | ○ | ○ | ○ |
| Adhesion (to SiN) | — | ○ | ○ | ○ |

Embodiments of the application of the polyimide resin composition of the present invention to the film formation in solar cells will now be described.
Production of Solar Cell The polycrystalline silicon solar cell having the structure shown in FIG. 2 was produced by using a polycrystalline silicon substrate (crystalline silicon substrate 1) with boron as a dopant. After texturing the surface of the substrate, a phosphorus diffusion layer (diffusion layer 2) was formed by using POCl$_3$. Then, a SiN film as an antireflection coating (surface antireflection coating 3) was formed by plasma CVD. A pattern using Ag paste was screen-printed on a SiN film and a pattern using aluminium paste was screen-printed on the backside, and the printed patterns were calcined to form the electrode on the light-receiving surface. The metal layer on the back surface was removed with hydrochloric acid, and only the backside BSF layer (BSF layer 4) was left. Thereafter, the polyimide compositions described in Examples 1 to 3 were applied by screen printing to a predetermined pattern to form the backside passivation layer (back reflection layer 7). The electrode on the backside (the second electrode 6) was formed by carrying out vapor deposition of aluminium.

For comparison, a sample obtained by not carrying out the printing of the polyimide, and by carrying out vapor deposition of aluminium on the entire surface of the backside BSF layer in the above production step. The results are shown in Table 3.

TABLE 3

| Polyimide layer | Short-circuit current (mA/cm$^2$) | Open-circuit voltage (V) | Fill factor | Conversion efficiency (%) |
|---|---|---|---|---|
| used | 36.9 | 0.620 | 0.739 | 16.9 |
| not used | 36.4 | 0.619 | 0.772 | 17.4 |

Comparing the case using the polyimide layer with the case not using the polyimide layer with respect to the short-circuit current showing the effect of the back reflection layer, the short-circuit current is increased by 0.5 mA/cm$^2$ when the polyimide layer was used, which shows the effect of the present invention.

The invention claimed is:

1. A method of forming a back reflection layer in a solar cell, said method comprising
coating a base layer on the back surface of said solar cell with a polyimide resin composition comprising an organic solvent, a polyimide resin having at least one group selected from the group consisting of alkyl groups and perfluoroalkyl groups in recurring units thereof, said polyimide resin being dissolved in said organic solvent, and light-reflecting metal oxide particles selected from the group consisting of silica ($SiO_2$), zirconia ($ZrO_2$), tantalum(V) oxide ($Ta_2O_5$), titanium oxide ($TiO_2$), zinc oxide ($ZnO_2$), and vanadium dioxide ($VO_2$), said particles being dispersed in said organic solvent, wherein said organic solvent is a mixed solvent comprising a hydrophobic organic solvent having a vapor pressure at room temperature of 1 mm Hg or lower and a hydrophilic organic solvent having a vapor pressure at room temperature of 1 mm Hg or lower, and
drying the resultant to form a polyimide film.

2. The method according to claim 1, wherein said polyimide film is formed by screen printing method, ink jet method or dispense method.

3. The method according to claim 1, wherein a polyimide film having a thickness of 1 μm or more after drying is formed by one coating.

4. The method according to claim 1, wherein said solar cell comprises:
a crystalline silicon substrate having a first conductivity type, which is composed of a single crystalline silicon or a polycrystalline silicon;
an impurity-diffused layer having a second conductivity type, which is formed on the light-receiving surface of the crystalline silicon substrate;
a first electrode formed on the surface of the impurity-diffused layer on the light-receiving surface of the crystalline silicon substrate;
a second electrode formed on the back surface of the crystalline silicon substrate; and
a back reflection layer formed on the back surface of the crystalline silicon substrate; wherein said second electrode provides a contact on the back surface of the crystalline silicon substrate through a plurality of openings of the back reflection layer.

5. The method according to claim 1, wherein said solar cell comprises:
a crystalline silicon substrate having a first conductivity type, which is composed of a single crystalline silicon or a polycrystalline silicon;
an impurity-diffused layer having a second conductivity type, which is formed on the light-receiving surface of the crystalline silicon substrate;
a first electrode formed on the surface of the impurity-diffused layer on the light-receiving surface of the crystalline silicon substrate;
a second electrode formed on the back surface of the crystalline silicon substrate; and
an impurity-diffused layer having a first conductivity type, which layer is formed on a part or all of the back surface of the crystalline silicon substrate, and in which layer higher concentrations of impurities than the concentration of impurities in the crystalline silicon substrate are added; and
a back reflection layer formed on the surface of the impurity-diffused layer having a first conductivity type;
wherein said second electrode provides a contact on the surface of the impurity-diffused layer on the back surface of the crystalline silicon substrate through a plurality of openings of the back reflection layer.

6. A solar cell comprising the back reflection layer formed by the method according to claim 1.

7. The method according to claim 1, wherein said light-reflecting particles are tantalum(V) oxide ($Ta_2O_5$).

8. The method according to claim 1, wherein the content of said light-reflecting particles in the composition is 10 to 50% by weight.

9. The method according to claim 1, wherein said light-reflecting particles have a particle size of 0.01 to 0.3 μm.

10. The method according to claim 1, wherein said polyimide resin comprises recurring units represented by the following formula [I]:

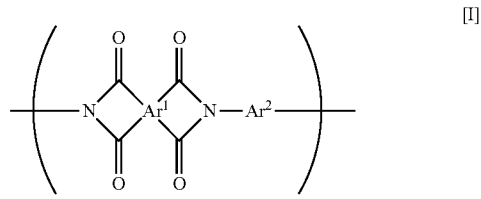

wherein $Ar^1$ represents an arbitrary tetravalent organic group, $Ar^2$ represents an arbitrary divalent organic group, and at least either one of $Ar^1$ and $Ar^2$ have said alkyl group and/or perfluoroalkyl group.

11. The method according to claim 10, wherein said $Ar^2$ is represented by the following formula [III]:

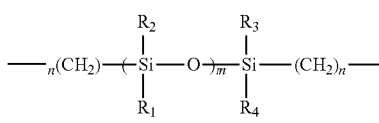

[III]

wherein $R_1$, $R_2$, $R_3$, and $R_4$ independently represent a member selected from the group consisting of hydrogen, a hydroxyl group, a $C_1$-$C_4$ alkyl group, a phenyl group, F, Cl, and Br, provided that at least one of $R_1$, $R_2$, $R_3$, and $R_4$ represents a $C_1$-$C_4$ alkyl group, and n and m independently represent an integer of 1 to 10.

12. The method according to claim 10, wherein said $Ar^2$ is represented by the following formula [IV]:

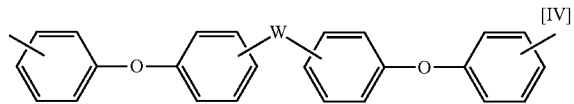

[IV]

wherein W represents —$C(CH_3)_2$— or —$C(CF_3)_2$—.

13. The method according to claim 10, wherein said $Ar^2$ is represented by the following formula [V]:

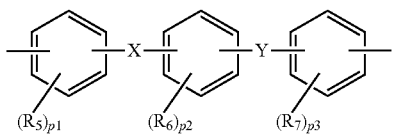

[V]

wherein
X and Y are independently selected from the group consisting of —C(=O)—, —$SO_2$—, —O—, —S—, —$(CH_2)_a$— where a represents an integer of 1 to 5, —NHCO—, —$C(CH_3)_2$—, —$C(CF_3)_2$—, —C(=O)O— and a single bond,
$R_5$, $R_6$, and $R_7$ are independently selected from the group consisting of hydrogen, a hydroxyl group, a $C_1$-$C_4$ alkyl group, a phenyl group, F, Cl, and Br, and
p1, p2 and p3 independently represent an integer of 1 to 4.

14. The method according to claim 1, wherein said polyimide resin contains 1,3-bis(3-aminopropyl)tetramethyldisiloxane in an amount of 1 to 25 mol % based on total diamine components.

15. The method according to claim 1, wherein the composition has a thixotropy coefficient of from 1.5 to 4.0.

16. The method according to claim 1, wherein the composition has a thixotropy coefficient of from 1.8 to 3.5.

17. The method according to claim 1, wherein the composition has a thixotropy coefficient of from 2.5 to 3.2.

* * * * *